(12) United States Patent
Chen

(10) Patent No.: US 10,741,618 B2
(45) Date of Patent: Aug. 11, 2020

(54) PIXEL STRUCTURE DRIVING METHOD

(71) Applicant: KUNSHAN GO-VISIONOX OPTO-ELECTRONICS CO., LTD., Jiangsu (CN)

(72) Inventor: Xinquan Chen, Jiangsu (CN)

(73) Assignee: KUNSHAN GO-VISIONOX OPTO-ELECTRONICS CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 16/324,281

(22) PCT Filed: Mar. 13, 2018

(86) PCT No.: PCT/CN2018/078788
§ 371 (c)(1),
(2) Date: Feb. 8, 2019

(87) PCT Pub. No.: WO2018/196496
PCT Pub. Date: Nov. 1, 2018

(65) Prior Publication Data
US 2019/0181191 A1    Jun. 13, 2019

(30) Foreign Application Priority Data

Apr. 28, 2017 (CN) .......................... 2017 1 0296173

(51) Int. Cl.
*H01L 27/32* (2006.01)
*G09G 3/20* (2006.01)
(Continued)

(52) U.S. Cl.
CPC ....... *H01L 27/3218* (2013.01); *G09G 3/2003* (2013.01); *G09G 3/32* (2013.01);
(Continued)

(58) Field of Classification Search
CPC ... G09G 2320/0233; G09G 2300/0452; G09G 3/3607; G09G 3/3208; G09G 5/02;
(Continued)

(56) References Cited

U.S. PATENT DOCUMENTS 9,338,364 B2 *  5/2016  Imade .................. G06T 3/4053
10,043,433 B2 *  8/2018  Sun ....................... G09G 3/3225
(Continued)

FOREIGN PATENT DOCUMENTS

CN    101510395 A    8/2009
CN    101763837 A    6/2010
(Continued)

*Primary Examiner* — Dismery Mercedes
(74) *Attorney, Agent, or Firm* — Muncy, Geissler, Olds & Lowe, P.C.

(57) ABSTRACT

A method for driving a pixel structure is disclosed. The pixel structure is divided into a number of target pixel unit groups each equivalent to a theoretical pixel unit group. A color component of each sub-pixel in the target pixel unit group is determined according to a color component of each sub-pixel in the corresponding theoretical pixel unit group. In the present invention, the conventional pixel structure is compressed to render a color component of at least one sub-pixel in the target pixel unit group equivalent to a maximum value or an average value of color components of two sub-pixels in the corresponding theoretical pixel unit group, such that at least one sub-pixel in the target pixel unit group undertakes functions of two sub-pixels in the corresponding theoretical pixel unit group.

16 Claims, 10 Drawing Sheets

(51) Int. Cl.
  *H01L 51/56*  (2006.01)
  *G09G 3/3208*  (2016.01)
  *G09G 3/32*  (2016.01)
  *G09G 3/36*  (2006.01)
  *G02F 1/1343*  (2006.01)

(52) U.S. Cl.
  CPC ......... *G09G 3/3208* (2013.01); *G09G 3/3607* (2013.01); *H01L 27/32* (2013.01); *H01L 27/326* (2013.01); *H01L 27/3216* (2013.01); *H01L 51/56* (2013.01); *G02F 2001/134345* (2013.01); *G02F 2201/52* (2013.01); *G09G 2300/0452* (2013.01); *G09G 2320/0242* (2013.01); *G09G 2340/0457* (2013.01); *H01L 27/3276* (2013.01)

(58) Field of Classification Search
  CPC ... G09G 2300/0443; G09G 2340/0457; G09G 2320/0242; G09G 3/2003; G09G 3/2074; G09G 3/3233; G06K 9/6202; G06K 9/4652; H01L 27/3216; H01L 27/3218; H01L 27/32; H01L 27/3211; H01L 27/326; G02F 2001/134345; G02F 2201/52
  See application file for complete search history.

(56) References Cited

U.S. PATENT DOCUMENTS

| | | | | |
|---|---|---|---|---|
| 10,297,182 B2* | 5/2019 | Guo | ..................... | G09G 3/2003 |
| 10,417,979 B2* | 9/2019 | Xu | ..................... | G02F 1/134309 |
| 10,431,151 B2* | 10/2019 | Song | ..................... | G09G 3/3225 |
| 10,468,471 B2* | 11/2019 | Lu | ..................... | G09G 3/20 |
| 2002/0154152 A1* | 10/2002 | Tezuka | ................ | G09G 3/3607 345/690 |
| 2007/0268503 A1* | 11/2007 | Seki | ........................ | H04N 5/357 358/1.9 |
| 2015/0029208 A1* | 1/2015 | Kim | ..................... | G09G 3/2092 345/590 |
| 2015/0364526 A1* | 12/2015 | Peng | ................... | H01L 27/3216 257/40 |
| 2016/0055780 A1* | 2/2016 | Guo | ..................... | G09G 3/2003 345/55 |
| 2016/0203800 A1* | 7/2016 | Chen | ........................ | G09G 5/02 345/694 |
| 2016/0240593 A1* | 8/2016 | Gu | ..................... | G09G 3/3225 |
| 2016/0300520 A1* | 10/2016 | Wang | ..................... | G09F 9/30 |
| 2016/0322432 A1* | 11/2016 | Yang | ..................... | G09G 3/3208 |
| 2016/0329385 A1* | 11/2016 | Qiu | ..................... | H01L 27/3218 |
| 2016/0342043 A1 | 11/2016 | Nakanishi et al. | | |
| 2016/0379533 A1* | 12/2016 | Guo | ..................... | H04N 13/324 345/694 |
| 2017/0032726 A1 | 2/2017 | Liu et al. | | |
| 2017/0103690 A1 | 4/2017 | Yang et al. | | |

FOREIGN PATENT DOCUMENTS

| | | |
|---|---|---|
| CN | 103715227 A | 4/2014 |
| CN | 104299561 A | 1/2015 |
| CN | 104505015 A | 4/2015 |
| CN | 104680949 A | 6/2015 |
| CN | 104778919 A | 7/2015 |
| CN | 104851901 A | 8/2015 |
| CN | 104992654 A | 10/2015 |
| CN | 106530995 A | 3/2017 |
| CN | 207068854 U | 3/2018 |
| TW | 200935380 A | 8/2009 |

* cited by examiner

PIXEL STRUCTURE DRIVING METHOD

TECHNICAL FIELD

The present invention relates to the field of display technologies, and in particular, to a drive method of a pixel structure.

BACKGROUND

An organic light-emitting diode (OLED) is an active light-emitting device. Compared with a liquid crystal display which is a conventional display manner, the OLED can self-emit light without the use of a backlight. The OLED is formed by a thin organic film and a glass substrate, and the organic material emits light in response to an electric current. Therefore, an OLED display screen can save electric energy significantly, and can be made lighter and thinner than an LCD display screen. In addition, the OLED display screen can withstand a temperature change in a wider range and enable a wider viewing angle compared to the LCD display screen. Thus, the OLED is expected to be the next generation of panel display technology after the LCD, and is one of the most popular panel display technologies.

There are multiple color patterning technologies for the OLED screen, among which the relatively mature one is OLED evaporation technology which has been successfully applied in mass production of the OLED screens. The conventional RGB Stripe layouts are used in this technology for evaporation, and an RGB side-by-side manner creates the most satisfactory picture effect. In the side-by-side manner, three sub-pixels that are red, green, and blue (R, G, and B) sub-pixels exist in one pixel range. Each sub-pixel is a rectangle, and corresponds to an independent organic light-emitting device. The organic light-emitting devices are formed on their corresponding pixel positions on an array substrate by using a Fine Metal Mask (FMM) through evaporation film-forming technology, where the FMM is briefly referred to as an evaporation mask. Manufacturing of high-PPI (Pixel Per Inch) OLED display screens depends on fineness and good mechanical stability of the FMM and a pixel arrangement manner.

FIG. 1 is a schematic diagram of a pixel arrangement of an OLED display screen in the prior art. Such a pixel structure is usually called Real RGB in the field. As shown in FIG. 1, this OLED display screen uses a pixel side-by-side arrangement, and each pixel unit includes an R sub-pixel region 101, a G sub-pixel region 103, and a B sub-pixel region 105. The R sub-pixel region 101 includes an R light-emitting region 102 and an R non-light-emitting region. The G sub-pixel region 103 includes a G light-emitting region 104 and a G non-light-emitting region. The B sub-pixel region 105 includes a B light-emitting region 106 and a B non-light-emitting region. FIG. 1 shows that the R, G, and B sub-pixels are all rectangular and their light-emitting regions are identical in area, and the R, G, and B sub-pixels are arranged in a straight line. The light-emitting region of each sub-pixel region includes a cathode, an anode, and an electroluminescent layer (also referred to as an organic emission layer), where the electroluminescent layer is located between the cathode and the anode, and used for producing lights with predetermined colors to implement display. During preparation of the display screen, the evaporation process usually needs to be performed three times to form an electroluminescent layer with a particular color in a light-emitting region of a pixel region with the corresponding color.

An FMM shown in FIG. 2 is generally used for evaporation of the pixel structure of the OLED display screen shown in FIG. 1. The FMM includes a shielding region 107 and several evaporation openings 108, and a shielding region between two adjacent evaporation openings 108 in the same column is called a bridge. Because the sub-pixels with the same color in the arrangement manner of FIG. 1 longitudinally align, the corresponding evaporation openings 108 on the FMM necessarily align in the same way. However, this arrangement causes the bridge between two vertically adjacent evaporation openings 108 to have a risk of disconnection. Moreover, each evaporation opening 108 on the FMM needs to correspond to a predetermined pixel position. However, space for alignment between the openings on the FMM and the sub-pixel regions is narrowed according to the conventional pixel arrangement manner, which probably incurs lack of color, color mixture, or other defects.

SUMMARY OF THE INVENTION

An objective of the present invention is to provide a method for driving a pixel structure, so as to solve the problems in the prior art.

To solve the foregoing technical problems, the present invention provides a method for driving a pixel structure, where the pixel structure includes a plurality of pixel rows, each pixel row comprising a first sub-pixel, a second sub-pixel, and a third sub-pixel arranged successively, two light-emitting regions of sub-pixels of a same color in two adjacent odd-numbered pixel rows are aligned with each other; light-emitting regions of sub-pixels of a same color in two adjacent even-numbered pixel rows are aligned with each other; and light-emitting regions of sub-pixels with a same color in adjacent odd-numbered and even-numbered pixel rows are staggered from each other.

The method for driving the pixel structure includes: dividing an image into a plurality of theoretical pixel unit groups each comprising four basic pixel units, each basic pixel unit comprising three sub-pixels arranged side by side, and determining a color component of each sub-pixel in the theoretical pixel unit group; and dividing the pixel structure into a plurality of target pixel unit groups each equivalent to one of the theoretical pixel unit groups, each of the target pixel unit groups comprising three target pixel units with each target pixel unit comprising three sub-pixels, and determining color component of each sub-pixel in the target pixel unit group according to the color component of each sub-pixel in the corresponding theoretical pixel unit group, wherein a color component of at least one sub-pixel in the target pixel unit group is equal to a maximum value or an average value of color components of two sub-pixels of a same color in the corresponding theoretical pixel unit group.

Alternatively, in the method for driving the pixel structure, in the target pixel unit group, a first target pixel unit and a second target pixel unit are triangular shaped, and a third target pixel unit is rectangular shaped.

Alternatively, in the method for driving the pixel structure, each of the first, second and third target pixel units has at least one sub-pixel having a color component that is equal to a maximum value or an average value of color components of two sub-pixels of the same color in the corresponding theoretical pixel unit group.

Alternatively, in the method for driving the pixel structure, each of the first target pixel unit and the second target pixel unit has two sub-pixels having color components that are equal to a maximum value or an average value of color components of two corresponding sub-pixels of the same color in the corresponding theoretical pixel unit group, and a color component of a sub-pixel in a middle position of the third target pixel unit is equal to a maximum value or an average value of color components of two sub-pixels of the same color in the corresponding theoretical pixel unit group.

Alternatively, in the method for driving the pixel structure, a color component of each of the three sub-pixels in the third target pixel unit is equal to a maximum value or an average value of color components of two corresponding sub-pixels of the same color in the corresponding theoretical pixel unit group.

Alternatively, in the method for driving the pixel structure, a color component of a sub-pixel in a middle position of the third target pixel unit is equal to a maximum value or an average value of color components of two sub-pixels of the same color in the corresponding theoretical pixel unit group.

Alternatively, in the method for driving the pixel structure, the maximum value or the average value of color components of two sub-pixels is determined by a drive IC of an OLED display screen.

Alternatively, in the method for driving the pixel structure, the first sub-pixel, the second sub-pixel, and the third sub-pixel are identical in shape and dimension, and each of the first sub-pixel, the second sub-pixel, and the third sub-pixel has a shape of a rectangle with a length-width ratio of smaller than 1.5:1. A common borderline between the first sub-pixel and the second sub-pixel that are adjacent to each other in a same row coincides with an extending center line of a closest third sub-pixel in an adjacent row along a column direction. Two adjacent sides of the first sub-pixel, the second sub-pixel or the third sub-pixel are connected by one or more arcs and/or one or more straight lines.

Alternatively, in the method for driving the pixel structure, the pixel structure is divided into a plurality of target pixel unit groups according to a Real RGB arrangement manner, dimensions of each of the target pixel unit groups in a row direction are equivalent to dimensions of a corresponding one of the theoretical pixel unit groups in the row direction, and dimensions of each of the target pixel unit groups in a column direction are equivalent to dimensions of a corresponding one of the theoretical pixel unit groups in the column direction.

Compared with the prior art, the present invention divides a pixel structure into multiple target pixel unit groups each equivalent to a theoretical pixel unit group, where a color component of each sub-pixel in the target pixel unit group is determined according to a color component of each sub-pixel in the theoretical pixel unit group. The present invention compresses four pixel units in the prior art into three pixel units, to render a color component of at least one sub-pixel in the target pixel unit group equivalent to a maximum value or an average value of color components of two sub-pixels in the theoretical pixel unit group. Thus, at least one sub-pixel in the target pixel unit group undertakes functions of two sub-pixels in the theoretical pixel unit group, implementing driving of the pixel structure.

DETAILED DESCRIPTION OF PREFERRED EMBODIMENTS

Figure 1:
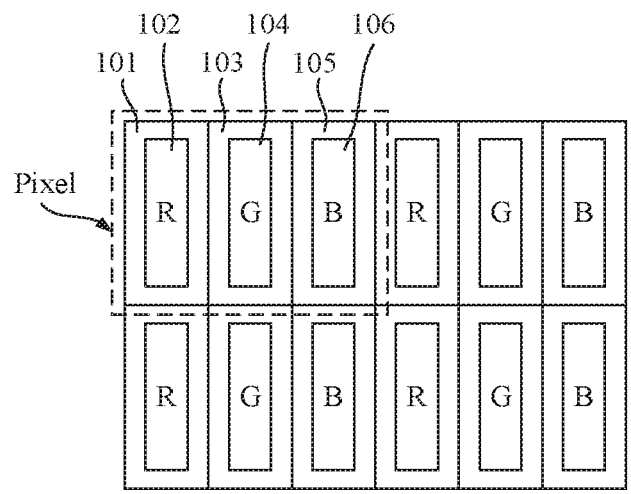
FIG. 1 is a schematic diagram of a pixel structure in the prior art.
Figure 2:
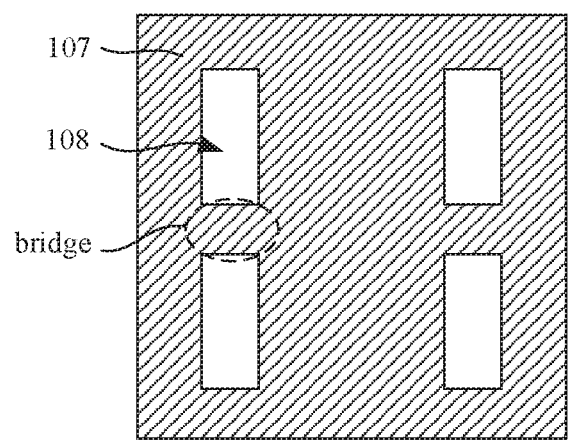
FIG. 2 is a schematic diagram of an FMM corresponding to FIG. 1.

As described in the background, manufacturing of high-PPI OLED display screens depends on fineness and good mechanical stability of the FMM and a pixel arrangement manner. The FMM is a key element in pixel evaporation. Therefore, it is necessary to put an end to occurrence of warping, cracking, or other problems in the FMM, thus avoiding defects affecting the evaporation quality, such as breaking up or shifting of an evaporated film. Pixel and sub-pixel arrangement manners are crucial to whether the FMM easily warps or cracks. That is, the pixel and sub-pixel arrangement manners greatly determine the mechanical properties of the FMM, and the mechanical properties of the FMM greatly determine the evaporation quality. In the FMM shown in FIG. 2, an evaporation opening is set at a position corresponding to a sub-pixel with a particular color. Because the sub-pixels with the same color in the Real RGB arrangement manner of FIG. 1 longitudinally align, the corresponding evaporation openings 108 on the FMM necessarily align in the same way, thus increasing the difficulty in mask manufacturing and implementation of an evaporation process.

Based on the foregoing research, the present invention provides a pixel structure of an OLED display screen. The pixel structure includes a plurality of pixel rows (or columns) that each includes a plurality of sub-pixels including a first sub-pixel, a second sub-pixel, and a third sub-pixel arranged successively and repeatedly. Light-emitting regions of the first sub-pixel, the second sub-pixel, and the third sub-pixel are all of rectangular having a length-width ratio smaller than 1.5:1. Light-emitting regions of sub-pixels with the same color in two adjacent odd-numbered rows (or columns) are aligned facing to each other. Light-emitting regions of sub-pixels with the same color in two adjacent even-numbered rows (or columns) are also aligned facing to each other. In addition, light-emitting regions of sub-pixels with the same color in adjacent odd-numbered and even-numbered rows (or columns) are staggered. The length-width ratio (the ratio of the length of the long side to the length of the short side) of each sub-pixel is set to be smaller than 1.5:1 (that is, the shape of each sub-pixel is a square or approximates a square), to ensure that the opening is as large as possible. Correspondingly, in order to ensure that the shape of each sub-pixel is a square or approximates a square, four pixel units (including 12 sub-pixels) are converted into three pixel units (including 9 sub-pixels). In addition, because the light-emitting regions of the sub-pixels with the same color in adjacent odd-numbered and even-numbered rows are staggered, the evaporation openings on the evaporation mask are also staggered, thus enhancing the strength of the evaporation mask, avoiding occurrence of warping, cracking, or other problems in the evaporation mask, reducing defects affecting the evaporation quality, such as breaking up or shifting of an evaporated film, and lowering the difficulty in mask manufacturing and implementation of the evaporation process. Furthermore, the first sub-pixel, the second sub-pixel, and the third sub-pixel are all identical in shape and dimensions, and openings on the evaporation mask are spaced equally, thus further enhancing the strength of the evaporation mask.

Therefore, the present invention further provides a method for driving a pixel structure. The method includes: dividing a to-be-displayed image into a plurality of theoretical pixel unit groups each including four basic pixel units, or called basic pixel groups, each basic pixel unit including three sub-pixels arranged side by side, and determining a color component of each sub-pixel in each theoretical pixel unit group; and dividing the pixel structure into a plurality of target pixel unit groups each equivalent to a theoretical pixel unit group. Each target pixel unit group includes three target pixel units. Each target pixel unit includes three sub-pixels. A color component of each sub-pixel in the target pixel unit group is determined according to the color component of each sub-pixel in the theoretical pixel unit group. A color component of at least one sub-pixel in the target pixel unit group is equal to a maximum value or an average value of color components of two sub-pixels with corresponding consistent colors in the theoretical pixel unit group. In this manner, four pixel units are compressed into three pixel units, realizing driving of the pixel structure.

The present invention is further described in detail below with reference to the accompanying drawings. The advantages and features of the present invention are more obvious according to the description and claims described below.

Figure 3:
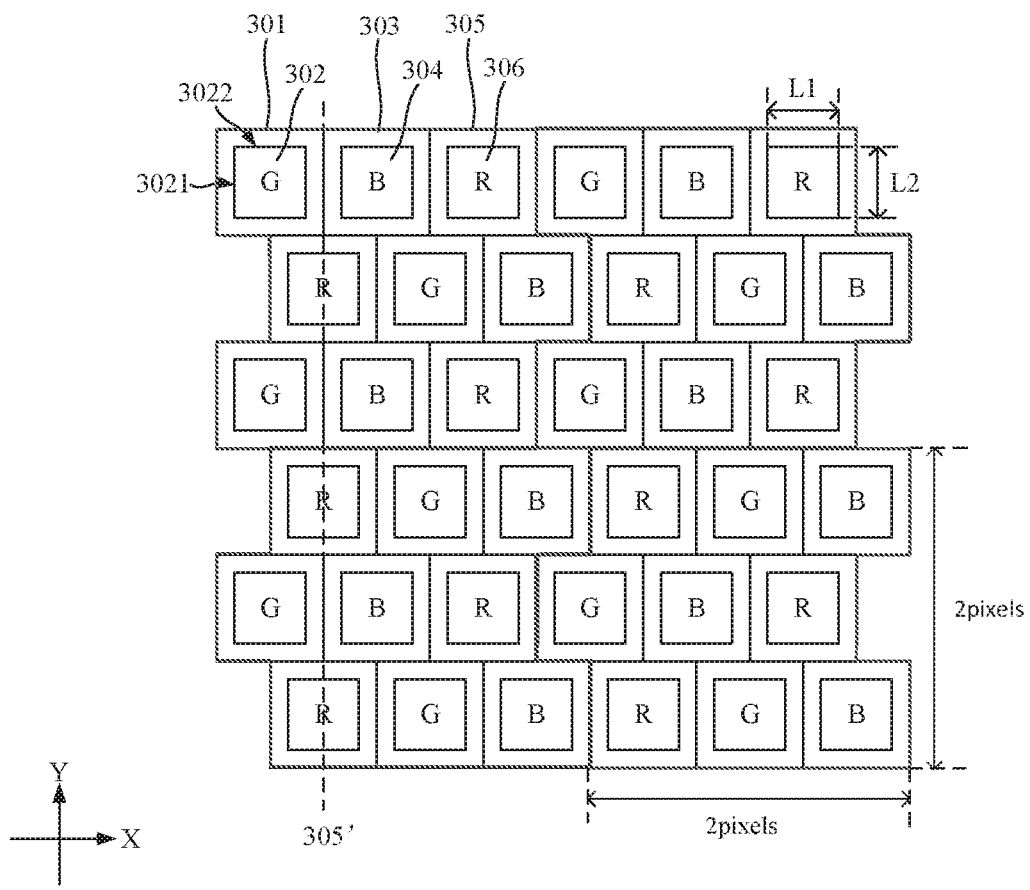
FIG. 3 is a schematic diagram of a pixel structure according to an embodiment of the present invention.

FIG. 3 is a schematic diagram showing a pixel arrangement of an OLED display screen according to an embodiment of the present invention. The X direction refers to an extending direction of each pixel row, and is also called a row direction (namely, a horizontal direction). The Y direction refers to a direction perpendicular to the X direction, and is also called a column direction (namely, a vertical direction). When a dimension of a light-emitting region of a sub-pixel in the row direction is smaller than that in the column direction, the column direction is referred to as the length direction of the sub-pixel and the row direction is referred to as the width direction of the sub-pixel. "The length of the sub-pixel" refers to a dimension of a light-emitting region of the sub-pixel in the column direction, while "the width of the sub-pixel" refers to a dimension of a light-emitting region of the sub-pixel in the row direction. When the dimension of a light-emitting region of the sub-pixel in the row direction is greater than that in the column direction, the row direction is referred to as the length direction of the sub-pixel and the column direction is referred to as the width direction of the sub-pixel. "The length of the sub-pixel" refers to a dimension of a light-emitting region of the sub-pixel in the row direction, while "the width of the sub-pixel" refers to a dimension of a light-emitting region of the sub-pixel in the column direction. "The length-width ratio of the sub-pixel" refers to a ratio of the maximum dimension of the light-emitting region of the sub-pixel in the length direction to the maximum dimension thereof in the width direction.

In addition, for brevity, only a part of an OLED display screen is shown in the figure, but the number of the pixel units in an actual product is not limited thereto and can be changed based on actual display requirements. The terms "first row", "second row", "first column", and "second column" . . . in the present invention are used for description of the present invention with the part shown in the figure as a reference standard, but do not denote the rows and columns in an actual product.

As shown in FIG. 3, a pixel structure 300 of the OLED display screen includes a plurality of pixel rows, and sub-pixels in the pixel structure are arranged side by side. Each pixel row includes a first sub-pixel 301, a second sub-pixel 303, and a third sub-pixel 305 successively and repeatedly arranged. Light-emitting regions of sub-pixels with the same color in two adjacent odd-numbered rows are aligned facing to each other, and light-emitting regions of sub-pixels with the same color in two adjacent even-numbered rows are also aligned facing to each other. However, light-emitting regions of sub-pixels with the same color in adjacent odd-numbered and even-numbered rows are staggered. In other words, the sub-pixels in all odd-numbered rows are arranged in the same manner, and the sub-pixels in all even-numbered rows are arranged also in the same manner. However, the light-emitting regions of the sub-pixels with the same color in an odd-numbered row and an even-numbered row are mutually staggered In this embodiment, the light-emitting regions of the first sub-pixel 301, the second sub-pixel 303, and the third sub-pixel 305 are all identical in shape and dimensions. A borderline between the first sub-pixel 301 and the second sub-pixel 303 that are adjacent to each other in the same row coincides with an extending center line of a light-emitting region of a closest third sub-pixel 305 in an adjacent row along the column direction, such that the RGB sub-pixels can be evenly distributed, and a preferred display effect can be achieved. Specifically, the extending center line 305' (where the extending center line 305' extends along the column direction and the extending center line 305' equally divides the third sub-pixel 305 into two parts) of the third sub-pixel 305 along the column direction coincides with a common borderline between the first sub-pixel 301 and the second sub-pixel 303. In other words, in the arrangement, sub-pixels (for example, the first sub-pixels 301) with the same color in the adjacent odd-numbered and even-numbered rows are staggered by a distance of 1.5 sub-pixels. That is, middle points of light-emitting regions of two sub-pixels with the same color that are closest to each other in two adjacent rows are spaced apart by a distance of the dimension of 1.5 sub-pixels in the row direction. Middle points of two sub-pixels with the same color closest to each other in the same row are spaced apart by a distance of the dimension of 3 sub-pixels in the row direction. It can be understood that, a first sub-pixel 301 and a second sub-pixel 303 of a pixel unit share one side, which is the common borderline between the first sub-pixel 301 and the second sub-pixel 303. However, the "border" or "borderline" described herein is not limited to a "border" or "borderline" of an actual product, but may refer to a virtual "border" or "borderline" between two sub-pixels. It should be noted that, although an optimal arrangement effect can be achieved in the case where the borderline between the adjacent first sub-pixel 301 and second sub-pixel 303 coincides with the extending center line of the closest third sub-pixel 305 in an adjacent row along the column direction, the distance by which the sub-pixels with the same color are staggered in the adjacent odd-numbered and even-numbered rows is not limited to 1.5 sub-pixels. For example, a distance of 1.4 to 1.6 sub-pixels is also acceptable.

The color of the first sub-pixel 301, the second sub-pixel 303, or the third sub-pixel 305 is any one of red, green, and blue. The colors of the sub-pixels 301, 303, and 305 are different from one another. For example, in FIG. 3, the first sub-pixel 301 is a green (G) sub-pixel, the second sub-pixel 303 is a blue (B) sub-pixel, and the third sub-pixel 305 is a red (R) sub-pixel. In each odd-numbered row, the multiple sub-pixels are repeatedly arranged according to a color sequence of G, B, R, G, B, R, . . . . In each even-numbered row, the plurality of sub-pixels are repeatedly arranged according to a color sequence of R, G, B, R, G, B . . . . Definitely, the first sub-pixel 01 may also be a blue sub-pixel or red sub-pixel, the second sub-pixel 303 may also be a green sub-pixel or red sub-pixel, and the third sub-pixel 305 may also be a green sub-pixel or blue sub-pixel, provided that the colors of the three sub-pixels 301, 303, and 305 are different from one another.

Each of the first sub-pixel 301, the second sub-pixel 303 and the third sub-pixel 305 includes a light-emitting region (a display region) and a non-light-emitting region (a non-display region). The light-emitting region of each sub-pixel includes a cathode, an anode, and an electroluminescent layer (also referred to as an organic emission layer). The electroluminescent layer is located between the cathode and the anode, and used for producing lights with predetermined colors to implement display. In this embodiment, the first sub-pixel 301 includes a G light-emitting region 302, the second sub-pixel 303 includes a B light-emitting region 304, and the third sub-pixel 305 includes an R light-emitting region 306. An evaporation process usually needs to be performed three times to form the electroluminescent layer with a particular color (for example, red, green, or blue) in a light-emitting region of a pixel region with the corresponding color.

Figure 4:
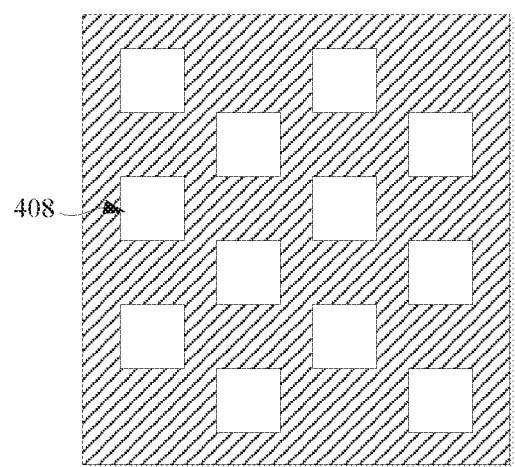
FIG. 4 is a schematic diagram of an FMM corresponding to FIG. 3.

FIG. 4 is a schematic diagram of an FMM applied to the pixel structure shown in FIG. 3. As shown in FIG. 4, the FMM 400 is provided with a plurality of evaporation openings 408. The evaporation openings 408 are corresponding to sub-pixels with the same color (for example, green) in FIG. 3. The sub-pixels with the same color in the adjacent odd-numbered and even-numbered rows are not longitudinally arranged in a line, but are mutually staggered (misaligned). Thus, the evaporation openings on the evaporation mask (the FMM) used for forming sub-pixels are also staggered. It can be seen from FIG. 4, due to the staggering arrangement, a distance between two evaporation openings 408 closest to each other in two adjacent rows is increased, thus enhancing the strength of the FMM, avoiding occurrence of warping, cracking, or other problems in the FMM, and reducing defects affecting the evaporation quality, such as breaking up or shifting of an evaporated film.

Referring to FIG. 3 continuously, in this embodiment, the light-emitting regions of the first sub-pixel 301, the second sub-pixel 303 and the third sub-pixel 305 are all quadrangles, and the length-width ratio (the ratio of the length of the long side to the length of the short side) of the light-emitting region of each sub-pixel is smaller than 1.5:1. That is, L2:L1<1.5:1 when L2 is the long side, or L1:L2<1.5:1 when L1 is the long side. The length-width ratio of each sub-pixel is set to be smaller than 1.5:1, to ensure that the opening is as large as possible. Correspondingly, in order to ensure that the shape of the sub-pixel is a square or approximates a square, the four pixel units in the Real RGB arrangement manner are converted into three pixel units in this embodiment, That is, for a 3*3 pixel array shown in FIG. 3, a dimension in the row direction is equivalent to that of two pixel units (2 pixels) in the Real RGB arrangement manner, and a dimension in the column direction is equivalent to that of two pixel units in the Real RGB arrangement manner. In other words, nine sub-pixels in this embodiment are equivalent to twelve sub-pixels in the prior art. Preferably, the light-emitting regions of the first sub-pixel 301, the second sub-pixel 303 and the third sub-pixel 305 are all squares. That is, the length-width ratio (L2:L1) of the light-emitting region of each sub-pixel is 1:1. Correspondingly, the evaporation openings 408 in FIG. 4 are also squares. The inventors find through research that, the closer the length-width ratio of the light-emitting region of the sub-pixel is to L1, the closer the length-width ratio of the evaporation opening on the FMM is to 1:1; then, the less likely the FMM is to warp and crack, and the higher strength the FMM can achieve.

Figure 5:
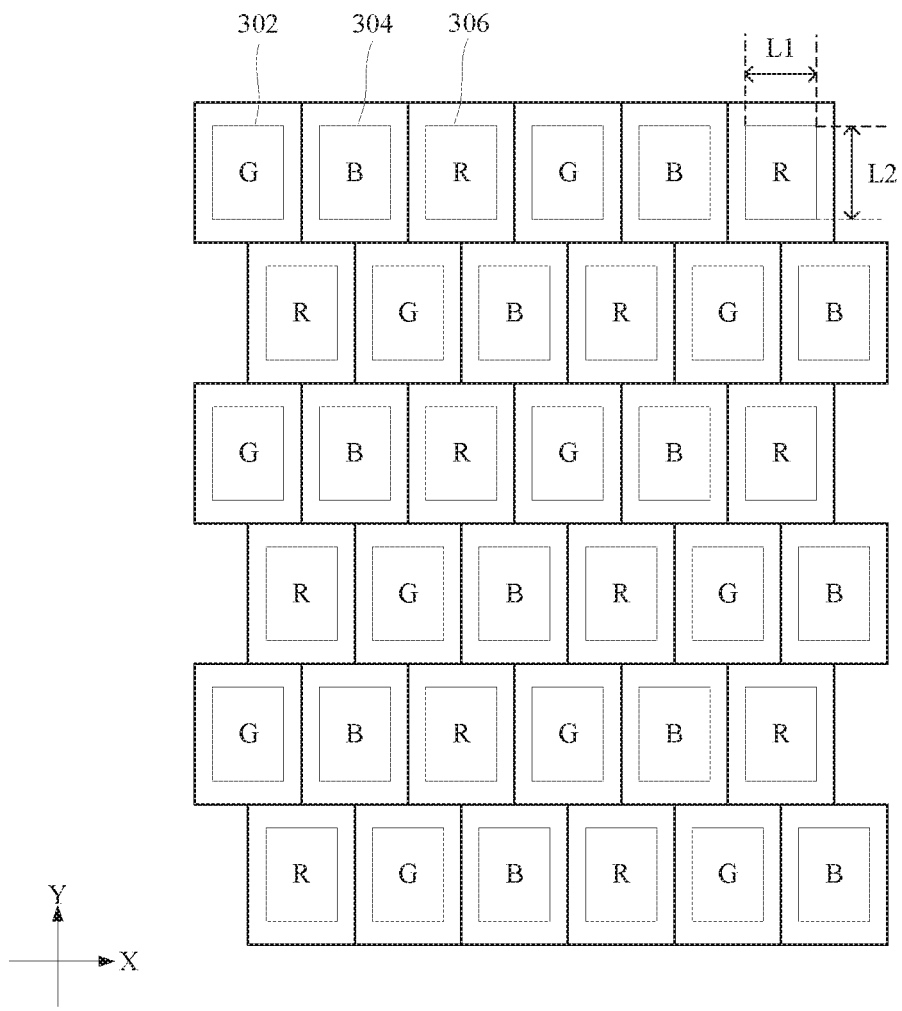
FIG. 5 is a schematic diagram of another pixel structure according to an embodiment of the present invention.

However, it should be noted that, the shapes of the light-emitting regions of the first sub-pixel 301, the second sub-pixel 303, and the third sub-pixel 305 are not limited to squares, and may also be rectangles of which the length-width ratio is smaller than 1.5:1. As shown in FIG. 5, L2 of the first sub-pixel 301, the second sub-pixel 303 and the third sub-pixel 305 is greater than L1 thereof. The length-width ratio (L2:L1) of each rectangular sub-pixel may be 1.1:1, 1.2:1, 1.3:1 or 1.4:1. As long as the ratio is smaller than 1.5:1, a preferred effect can be obtained.

In addition, it can be understood that, a certain deviation is allowed between actual shapes (and dimensions) of various products and a designed shape (and dimensions) during actual production. Generally, as long as the actual shape (and dimensions) of a product falls within an allowable range of deviation based on the designed shape (and dimensions), usage requirements can be met. For example, the light-emitting regions of the first sub-pixel 301, the second sub-pixel 303, and the third sub-pixel 305 may also be square-like or rectangle-like shapes, for example, a trapezoid approximating a rectangle or square, which may be an isosceles trapezoid, a non-isosceles trapezoid, a regular trapezoid, an inverted trapezoid, a trapezoid rotated leftwards by 90 degrees, or a trapezoid rotated rightwards by 90 degrees. In a preferred solution, the trapezoid is an isosceles trapezoid, where a difference value between lengths of the upper base and lower base of the isosceles trapezoid is smaller than 10% of the length of the lower base, angles between the two legs and the upper base of the isosceles trapezoid are both greater than 90° and smaller than 100°, and angles between the two legs and the lower base of the isosceles trapezoid are both greater than 80° and smaller than 90°. The shapes of the light-emitting regions of the first sub-pixel 301, the second sub-pixel 303, and the third sub-pixel 305 are still roughly quadrangles (within an allowable range of deviation), and a preferred arrangement effect can still be obtained. It can be understood that, when the shapes of the light-emitting regions of the first sub-pixel 301, the second sub-pixel 303, and the third sub-pixel 305 are regular trapezoids or inverted trapezoids, a maximum value in an average value of the lengths of the upper base and the lower base and the height of the trapezoid is regarded as a trapezoid dimension in the length direction; and a minimum value in the average value of the lengths of the upper base and the lower base and the height of the trapezoid is regarded as a trapezoid dimension in the width direction, where a ratio of the trapezoid dimension in the length direction to the trapezoid dimension in the width direction is smaller than 1.5.

Figure 6:
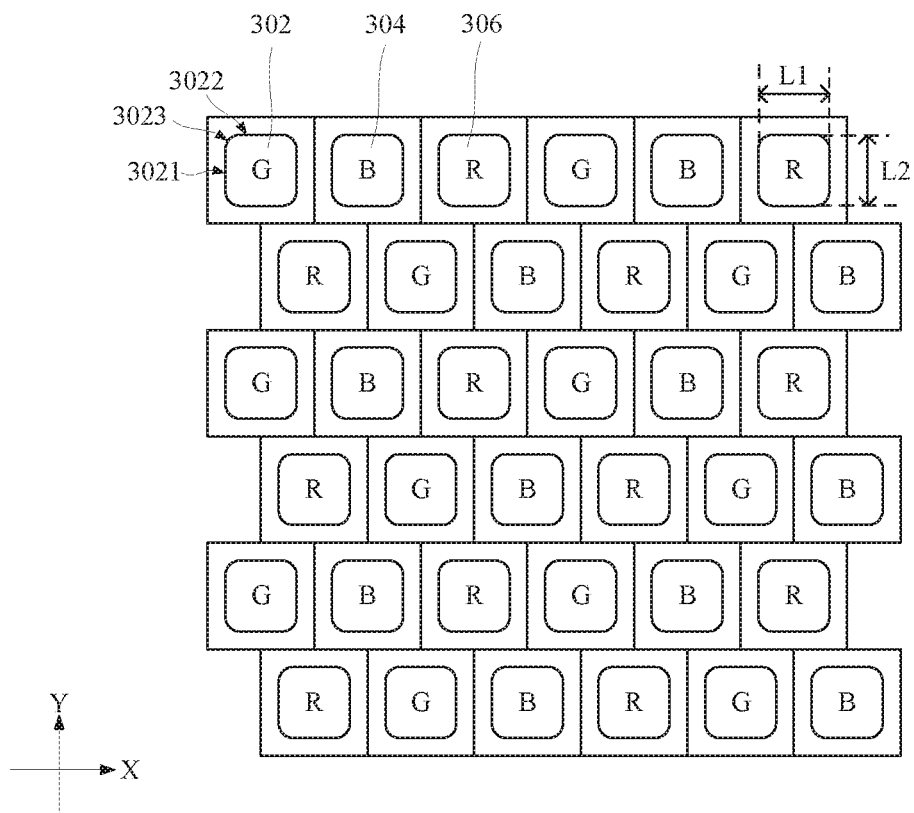
FIG. 6 is a schematic diagram of still another pixel structure according to an embodiment of the present invention.
Figure 7:
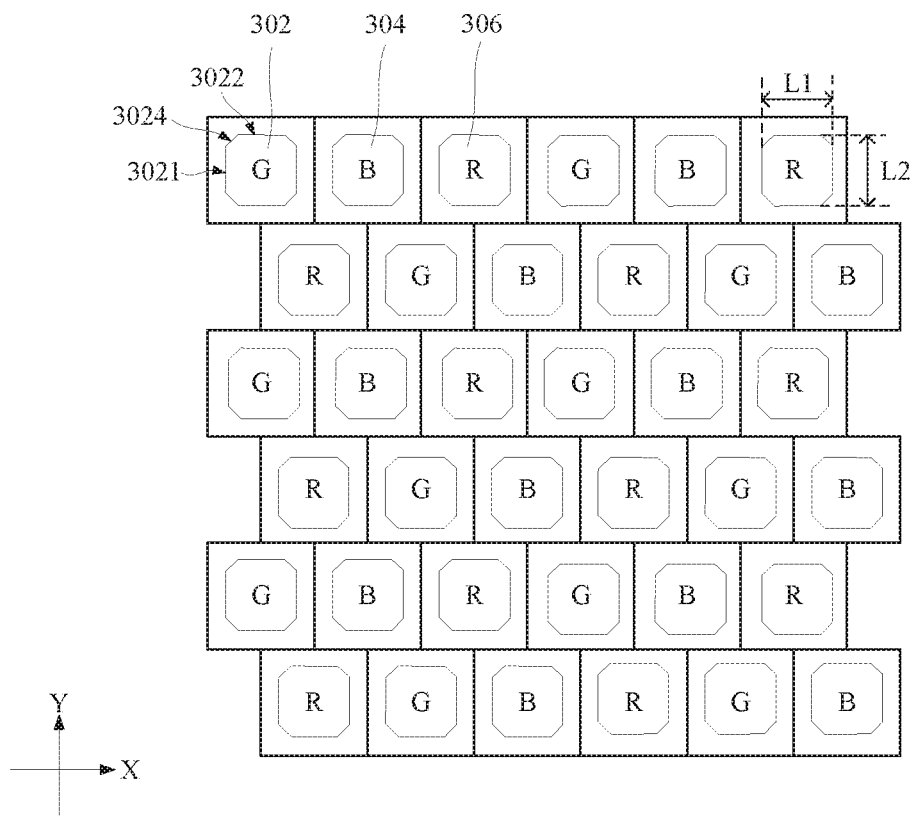
FIG. 7 is a schematic diagram of yet another pixel structure according to an embodiment of the present invention.

On the other hand, as described above, although an optimal effect can be achieved in the case where the shapes of the light-emitting regions of the first sub-pixel 301, the second sub-pixel 303, and the third sub-pixel 305 are all squares, it is unlikely that a perfect square with rather ideal angles can be obtained during actual production. Therefore, it should be noted that, some proper deformations are allowed. For example, the two adjacent sides 3021 and 3022 may not directly intersect at a right angle, as shown in FIG. 3. Instead, they are connected to form a curved intersection (that is, the two adjacent sides 3021 and 3022 are connected by a curved line segment 3023), that is, the angles of the square are all arc-shaped, as shown in FIG. 6. For another example, the two adjacent sides 3021 and 3022 may also be connected by a straight line segment 3024, such that the quadrangle extends into an octagon which has a quadrate outline with the length-width ratio still being smaller than 1.5:1 as shown in FIG. 7. Alternatively, the two adjacent sides 3021 and 3022 may also be connected by two straight line segments, such that the quadrangle is extended into a dodecagon. To sum up, as long as the light-emitting regions of the first sub-pixel 301, the second sub-pixel 303, and the third sub-pixel 305 are quadrate outlines on the whole and the length-width ratio thereof is smaller than 1.5:1, the objective of the present invention can still be achieved.

Figure 8:
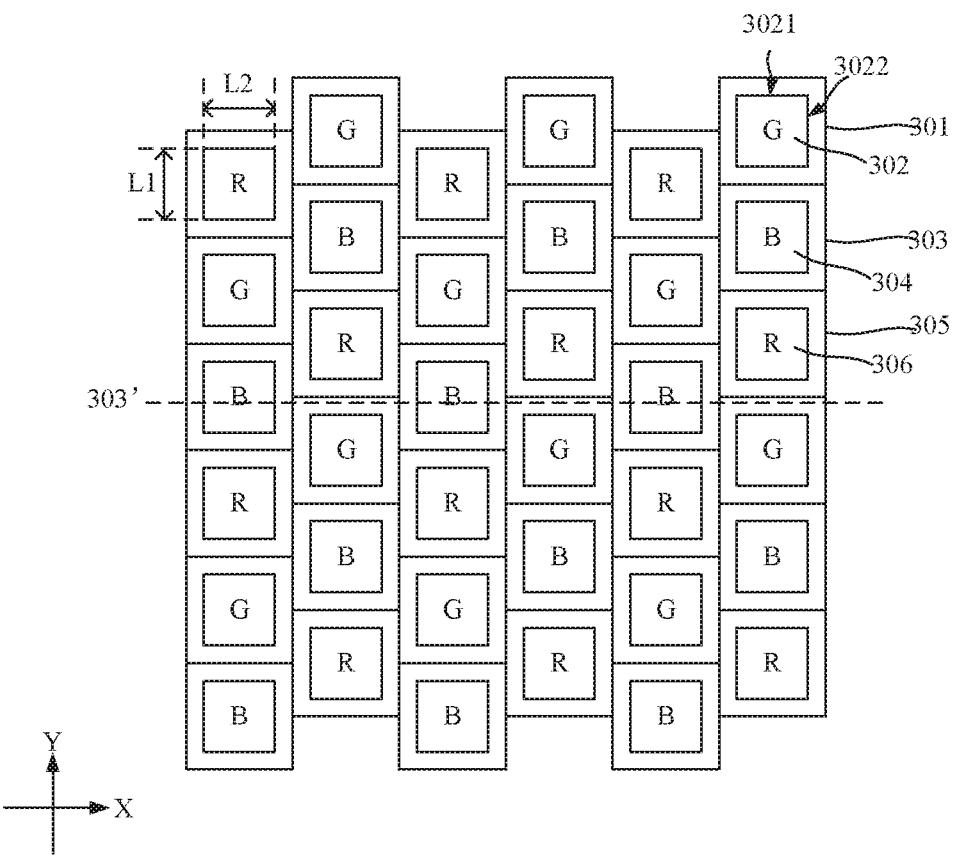
FIG. 8 is a schematic diagram of still yet another pixel structure according to an embodiment of the present invention.

In addition, as required in actual design and production, the pixel structure shown in FIG. 3 may be rotated leftwards or rightwards by 90 degrees or 180 degrees. For example, the structure shown in FIG. 3 is rotated leftwards by 90 degrees, to obtain a pixel structure shown in FIG. 8. As shown in FIG. 8, the pixel structure includes a plurality of pixel columns. Each pixel column includes a first sub-pixel 301, a second sub-pixel 303, and a third sub-pixel 305 successively and repeatedly arranged. Light-emitting regions of sub-pixels with the same color in two adjacent odd-numbered columns are aligned facing to each other, and light-emitting regions of sub-pixels with the same color in two adjacent even-numbered columns also are aligned facing to each other. However, light-emitting regions of sub-pixels with the same color in adjacent odd-numbered and even-numbered columns are staggered. In other words, the sub-pixels in all odd-numbered columns are arranged in the same manner, and the sub-pixels in all even-numbered columns are arranged in the same manner. However, the light-emitting regions of the sub-pixels with the same color in the adjacent odd-numbered and even-numbered columns are not horizontally arranged in a line, but are mutually staggered (misaligned). A row direction and a column direction in FIG. 8 are obtained by swapping the row direction and the column direction in FIG. 3. However, the length-width ratio of the light-emitting region of each sub-pixel is still smaller than 1.5:1, and preferably, the length-width ratio is 1:1. The closer the length-width ratio of each evaporation opening on an FMM is to 1:1, it's more difficult to wrap or crack the FMM, and the higher strength the FMM can achieve.

Figure 9:
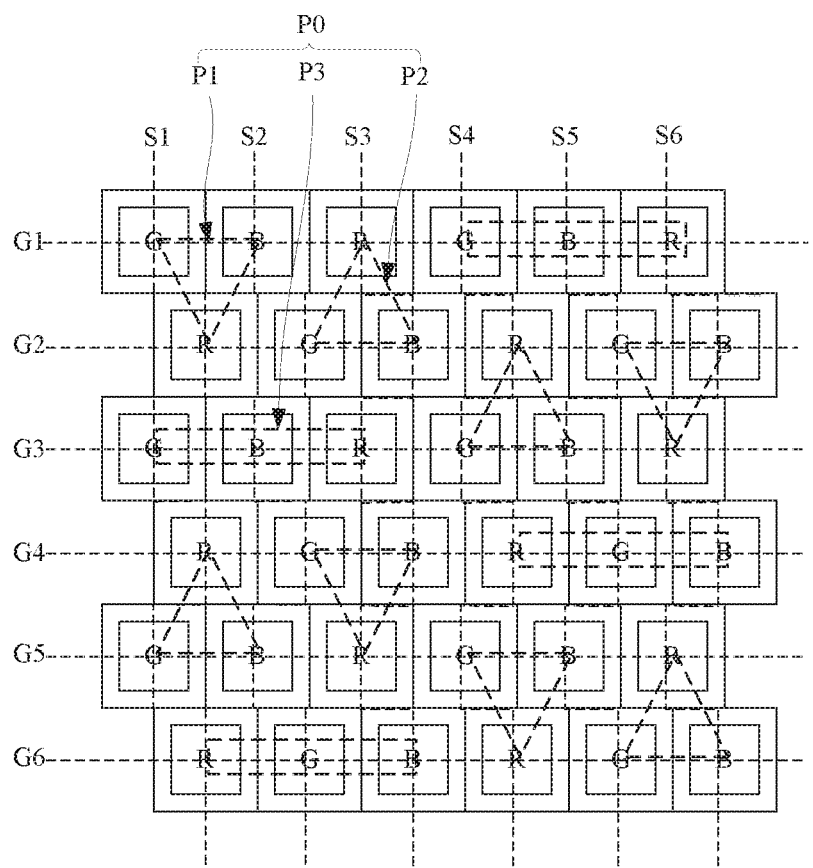
FIG. 9 is a schematic diagram of a pixel structure connected to gate lines and data lines according to an embodiment of the present invention.

Another aspect of this embodiment further provides an OLED display screen which can use any one of the pixel structures described above. By using the pixel structure 300 shown in FIG. 3 as an example, each pixel row in the pixel structure 300 is connected to a gate line, and each pixel column is connected to a data line. As shown in FIG. 9, the multiple pixel rows are respectively connected to gate lines G1, G2, G3, . . . , and the plurality of pixel columns are respectively connected to data lines S1, S2, S3, . . . . Further, because the light-emitting regions of the sub-pixels with the same color in the odd-numbered and even-numbered rows in the pixel structure 300 are staggered, the data lines can be in a bent state.

Referring to FIG. 9 continuously, the pixel structure of the OLED display screen includes a plurality of target pixel unit groups P0. Each target pixel unit group P0 is equivalent to a theoretical pixel unit group in a Real RGB pixel structure. That is, the dimensions of a target pixel unit group and the dimensions of a theoretical pixel unit group are equal in the row direction, and the dimensions of a target pixel unit group and the dimensions of a theoretical pixel unit group are equal in the column direction. Each target pixel unit group P0 includes three target pixel units P1, P2, and P3, and each target pixel unit includes three sub-pixels. Among the three target pixel units, the first pixel unit P1 and the second pixel unit P2 are arrange side by side on the same straight line, while the third pixel unit P3 is arranged on another straight line. The sub-pixels in the first pixel unit P1 and those in the second pixel unit P2 are triangularly distributed, while the sub-pixels in the third pixel unit P3 are linearly distributed. That is, the pixel units P1 and P2 are both triangle shapes, while the pixel unit P3 is a rectangle shape.

Herein, each target pixel unit group P0 includes nine sub-pixels, and therefore, each target pixel unit group P0 is connected to three gate lines and three data lines. In conjunction with FIG. 10, in the conventional Real RGB pixel structure, each theoretical pixel unit group includes four basic pixel units, and each basic pixel unit includes three sub-pixels. That is, each theoretical pixel unit group includes twelve sub-pixels, and is connected to two gate lines and six data lines. By comparison, although the number of gate lines connected in the pixel structure of this embodiment is more than that connected in the Real RGB pixel structure (the number of gate lines connected to each pixel unit group in this embodiment is 1.5 times as many as that in the Real RGB pixel structure), the number of data lines connected in this embodiment is less than that connected in the Real RGB pixel structure (the number of data lines connected to each pixel unit group in this embodiment is 50% of that in the Real RGB pixel structure). Therefore, the number of total signal lines connected to the display screen is reduced.

For the foregoing pixel structure, this embodiment further provides a drive method, which includes the following steps:

dividing a to-be-displayed image into a plurality of theoretical pixel unit groups each include four basic pixel units distributed in an array, each basic pixel unit including three sub-pixels arranged side by side, and determining a color component of each sub-pixel in each theoretical pixel unit group; and dividing the pixel structure into multiple target pixel unit groups each equivalent to a theoretical pixel unit group, each target pixel unit group including three target pixel units distributed in an array, and each target pixel unit including three sub-pixels, and determining a color component actually borne by each sub-pixel in the target pixel unit group according to the color component of each sub-pixel in the theoretical pixel unit group, where a color component of at least one sub-pixel in the target pixel unit group is equal to a maximum value or an average value of color components of two sub-pixels with corresponding consistent colors in the theoretical pixel unit group.

The drive method of this embodiment is described in detail below with reference to FIG. 10 and FIG. 11.

Before display of an image, the to-be-displayed image is first divided into multiple theoretical pixel unit groups according to the Real RGB pixel structure, and then the pixel structure is divided into multiple target pixel unit groups, where each target pixel unit group is equivalent to a theoretical pixel unit group.

Figure 10:
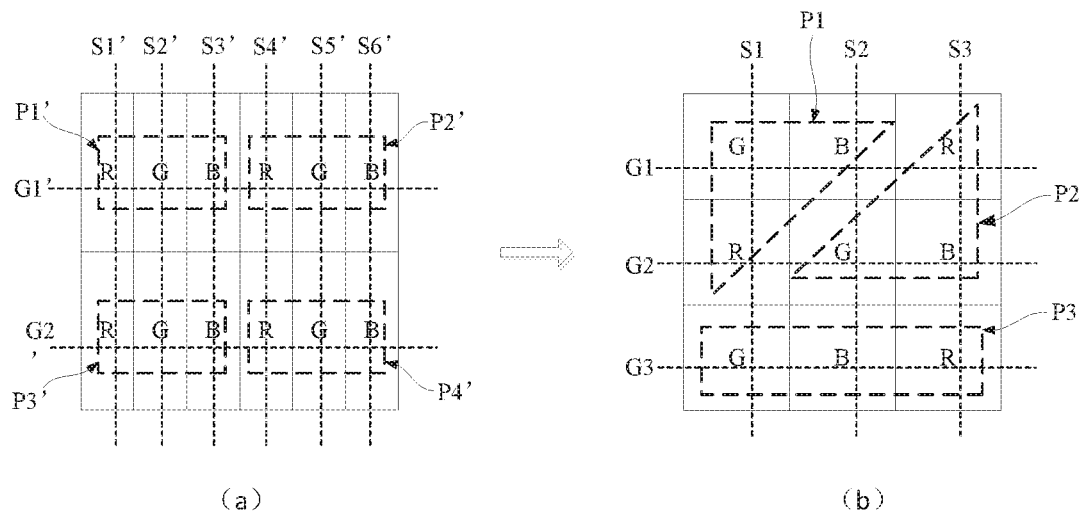
FIG. 10 is a schematic equivalent diagram of a theoretical pixel unit group according to an embodiment of the present invention.
Figure 11:
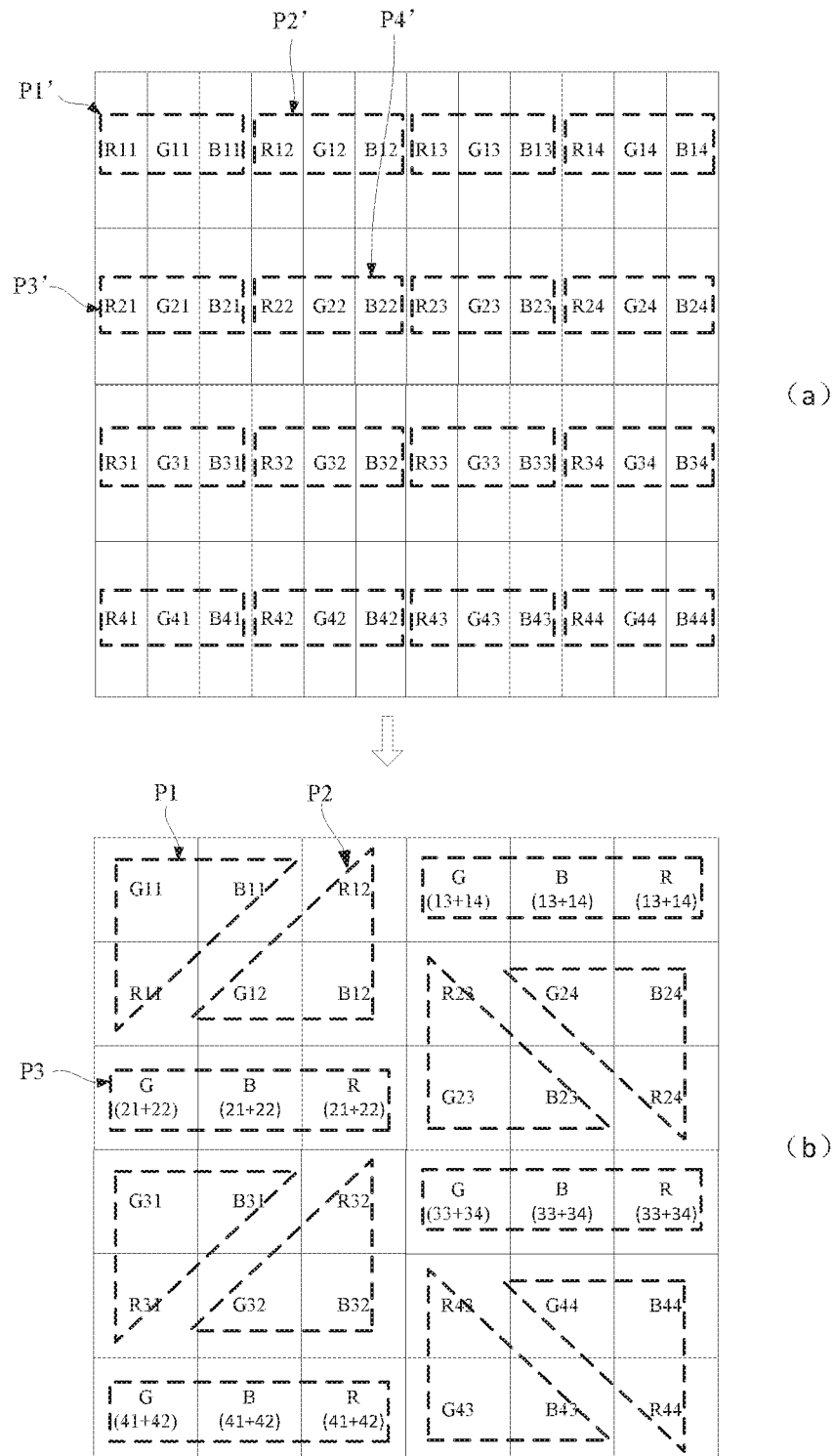
FIG. 11 is a schematic equivalent diagram of four theoretical pixel unit groups according to an embodiment of the present invention.

FIG. 10 is a schematic equivalent figure of a theoretical pixel unit group according to an embodiment of the present invention. FIG. 10(a) is a schematic figure of a theoretical pixel unit group in a Real RGB pixel structure. FIG. 10(b) is a schematic figure of a target pixel unit group in the pixel structure of this embodiment.

As shown in FIG. 10(a), the theoretical pixel unit group includes four basic pixel units P1', P2', P3' and P4', and each basic pixel unit includes three sub-pixels arranged side by side. The three sub-pixels includes an R sub-pixel, a G sub-pixel, and a B sub-pixel. The sub-pixels in the basic pixel units P1' and P2' and the sub-pixels in the basic pixel units P3' and P4' are arranged on two different rows respectively. The basic pixel unit P1' is under control of a gate line G1' and data lines S1', S2' and S3'. The basic pixel unit P2' is under control of the gate line G1' and data lines S4', S5' and S6'. The basic pixel unit P3' is under control of a gate line G2' and the data lines S1', S2' and S3'. The basic pixel unit P4' is under control of the gate line G2' and the data lines S4', S5' and S6'. It can be seen that, the four basic pixel units P1', P2', P3' and P4' are all of rectangle shapes.

As shown in FIG. 10(b), the target pixel unit group includes three target pixel units P1, P2, and P3, and each target pixel unit includes three sub-pixels arranged side by side. The three sub-pixels include an R sub-pixel, a G sub-pixel, and a B sub-pixel. The target pixel unit P1 is under control of gate lines G1 and G2 and data lines S1 and S2. The target pixel unit P2 is under control of the gate lines G1 and G2 and data lines S2 and S3. The target pixel unit P3 is under control of a gate line G3 and the data lines S1, S2 and S3. It can be seen that, the target pixel units P1 and P2 are both of triangle shapes, while the target pixel unit P3 is of a rectangle shape.

When a color component of each sub-pixel in the theoretical pixel unit group is determined, the color components are mapped to the target pixel units. Specifically, in FIG. 10, the target pixel unit P1 bears a color component of the basic pixel unit P1', the target pixel unit P2 bears a color component of the basic pixel unit P2', and the target pixel unit P3 bears color components of the basic pixel units P3' and P4'. In detail, a color component of at least one sub-pixel in the target pixel unit P3 is equal to a maximum value or an average value of color components of two sub-pixels with corresponding consistent colors in the basic pixel units P3' and P4'.

FIG. 11(a) is a schematic figure of four theoretical pixel unit groups in a Real RGB pixel structure, and FIG. 11(b) is a schematic figure of four target pixel unit groups in a pixel structure of this embodiment.

As shown in FIG. 11(a), in a basic pixel unit P1' in the first row and first column of the theoretical pixel unit groups, a red sub-pixel is recorded as R11, a green sub-pixel is recorded as G11, and a blue sub-pixel is recorded as B11. In a basic pixel unit P2' in the first row and second column, a red sub-pixel is recorded as R12, a green sub-pixel is recorded as G12, and a blue sub-pixel is recorded as B12. In a basic pixel unit P3' in the second row and first column, a red sub-pixel is recorded as R21, a green sub-pixel is recorded as G21, and a blue sub-pixel is recorded as B21. In a basic pixel unit P4' in the second row and second column, a red sub-pixel is recorded as R22, a green sub-pixel is recorded as G22, and a blue sub-pixel is recorded as B22. The rest can be done in the same manner.

In actual display, a target pixel unit P1 is equivalent to the basic pixel unit P1'. Therefore, a red sub-pixel in the target pixel unit P1 bears the color component of the red sub-pixel R11 in the basic pixel unit P1', a green sub-pixel in the target pixel unit P1 bears the color component of the green sub-pixel G11 in the basic pixel unit P1', and a blue sub-pixel in the target pixel unit P1 bears the color component of the blue sub-pixel B11 in the basic pixel unit P1'. In addition, a target pixel unit P2 is equivalent to the basic pixel unit P2'. Therefore, a red sub-pixel in the target pixel unit P2 bears the color component of the red sub-pixel R12 in the basic pixel unit P2', a green sub-pixel in the target pixel unit P2 bears the color component of the green sub-pixel G12 in the basic pixel unit P2', and a blue sub-pixel in the target pixel unit P2 bears the color component of the blue sub-pixel B12 in the basic pixel unit P2'.

Because the three pixel units in a target pixel unit group need to bear the color components of the four pixel units in a theoretical pixel unit group, the target pixel unit P3 is equivalent to the basic pixel units P3' and P4'. In one manner, a maximum value in color components of two sub-pixels with corresponding consistent colors in the basic pixel units P3' and P4' is determined by comparison, and a color component of a sub-pixel with the corresponding color in the target pixel unit P3 is equivalent to this maximum value. For example, the color component of the red sub-pixel in the target pixel unit P3 is equivalent to a maximum value in the two red sub-pixels R21 and R22 in the basic pixel units P3' and P4'; the color component of the green sub-pixel in the target pixel unit P3 is equivalent to a maximum value in the two green sub-pixels G21 and G22 in the basic pixel units P3' and P4'; and the color component of the blue sub-pixel in the target pixel unit P3 is equivalent to a maximum value in the two blue sub-pixels B21 and B22 in the basic pixel units P3' and P4'. In another manner, an average value of color components of two sub-pixels with corresponding consistent colors in the basic pixel units P3' and P4' is acquired, and a color component of a sub-pixel with the corresponding color in the target pixel unit P3 is equivalent to this average value.

The foregoing drive procedure can be controlled by a drive IC of the display screen. By use of the drive IC, magnitude of data voltages of two sub-pixels is compared to determine values of color components of the two sub-pixels, so as to control a sub-pixel in a target pixel unit to be displayed according to a maximum value in color components of two sub-pixels with corresponding consistent colors in a theoretical pixel unit group. Alternatively, in a similar way, the drive IC is used to calculate an average value of color components of two sub-pixels, so as to control a sub-pixel in a target pixel unit to be displayed according to the average value of the color components of the two sub-pixels with corresponding consistent colors in a theoretical pixel unit group.

Further, as shown in FIG. 11(b), two adjacent target pixel unit groups in the column direction have identical structures, and two adjacent target pixel unit groups in the row direction attain identical structures if turned over by 180 degrees. That is, two triangular pixel units (for example, P1 and P2) in a target pixel unit group are disposed on the upper side, while a rectangular pixel unit (for example, P3) is disposed on the lower side. On the contrary, in another adjacent target pixel unit group in a row direction, two triangular pixel units are on the lower side, while a rectangular pixel unit is on the upper side. In this way, in two adjacent target pixel unit groups, sub-pixels of a target pixel unit that needs to be equivalent to two basic pixel units are distributed in different rows.

Figure 12:
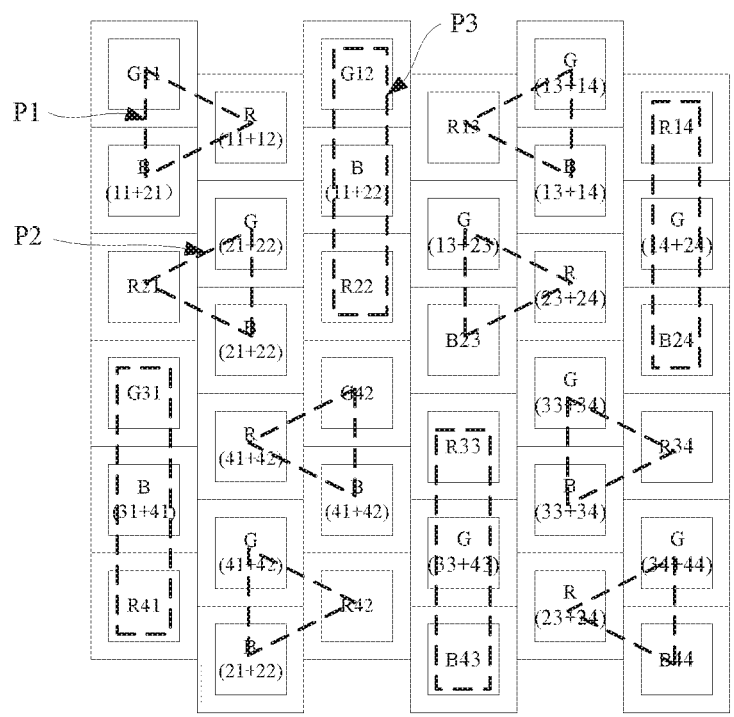
FIG. 12 is a schematic diagram of a pixel structure which bears color components according to an embodiment of the present invention.

The present invention can also make some changes to the structure of the pixel unit. Another drive method of this embodiment is described below in detail with reference to FIGS. 12 and 13.

Figure 13:
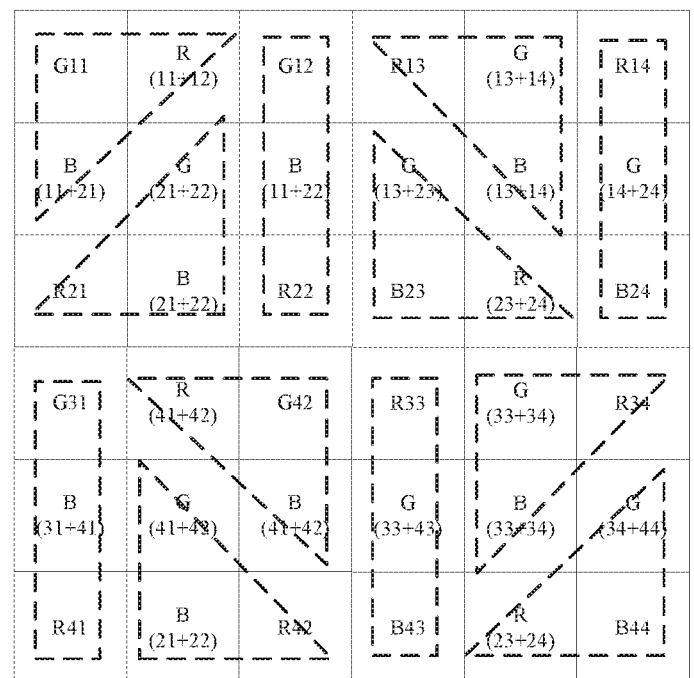
FIG. 13 is a schematic equivalent diagram of the pixel structure in FIG. 12.

As shown in FIG. 13, in a target pixel unit group, sub-pixels in the middle row and sub-pixels in the middle column need to bear color components of sub-pixels with corresponding consistent colors in two basic pixel units, and output a maximum value or an average value of the color components of the sub-pixels with corresponding consistent colors in the two basic pixel units.

Specifically, a color component of the green sub-pixel in the target pixel unit P1 is equivalent to that of the green sub-pixel G11 in the basic pixel unit P1'; a color component of the red sub-pixel in the target pixel unit P1 is equivalent to a maximum value or an average value of color components of two red sub-pixels R11 and R12 in the basic pixel units P1' and P2'; and a color component of the blue sub-pixel in the target pixel unit P1 is equivalent to a maximum value or an average value of color components of two blue sub-pixels B11 and B12 in the basic pixel units P1' and P3'. A color component of the red sub-pixel in the target pixel unit P2 is equivalent to that of the red sub-pixel R21 in the basic pixel unit P3'; a color component of the green sub-pixel in the target pixel unit P2 is equivalent to a maximum value or an average value of color components of two green sub-pixels G21 and G22 in the basic pixel units P3' and P4'; and a color component of the blue sub-pixel in the target pixel unit P2 is equivalent to a maximum value or an average value of color components of two blue sub-pixels B21 and B22 in the basic pixel units P3' and P4'. A color component of the red sub-pixel in the target pixel unit P3 is equivalent to that of the red sub-pixel R22 in the basic pixel unit P4'. A color component of the green sub-pixel in the target pixel unit P3 is equivalent to that of the green sub-pixel G12 in the basic pixel unit P2'. A color component of the blue sub-pixel in the target pixel unit P3 is equivalent to a maximum value or an average value of color components of two blue sub-pixels B11 and B22 in the basic pixel units P1' and P4'. In this way, in target pixel units of each target pixel unit group, sub-pixels that need to bear color components of sub-pixels of two basic pixel units are distributed in a cross pattern on the whole.

Still another drive method of this embodiment is described in detail below with reference to FIGS. 14 and 15.

Figure 14:
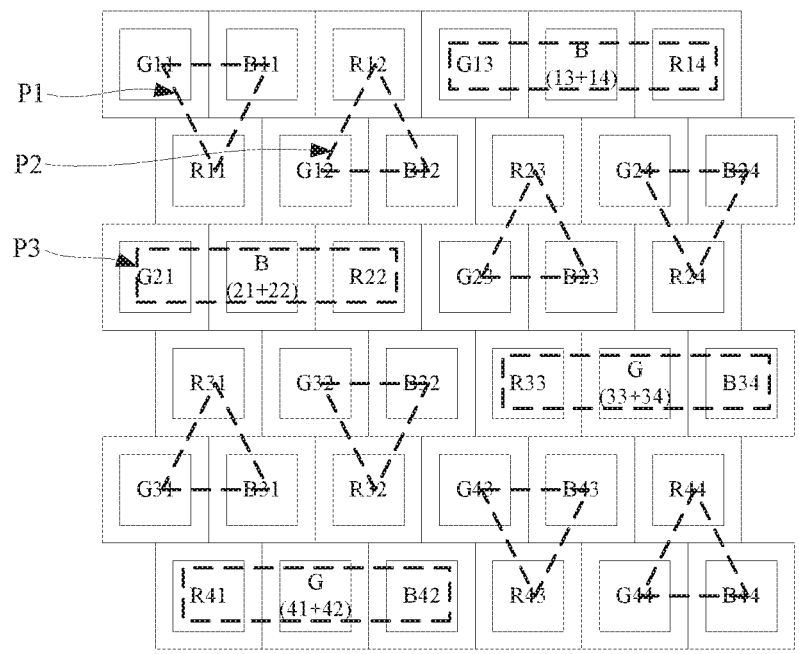
FIG. 14 is a schematic diagram of another pixel structure which bears color components according to an embodiment of the present invention.
Figure 15:
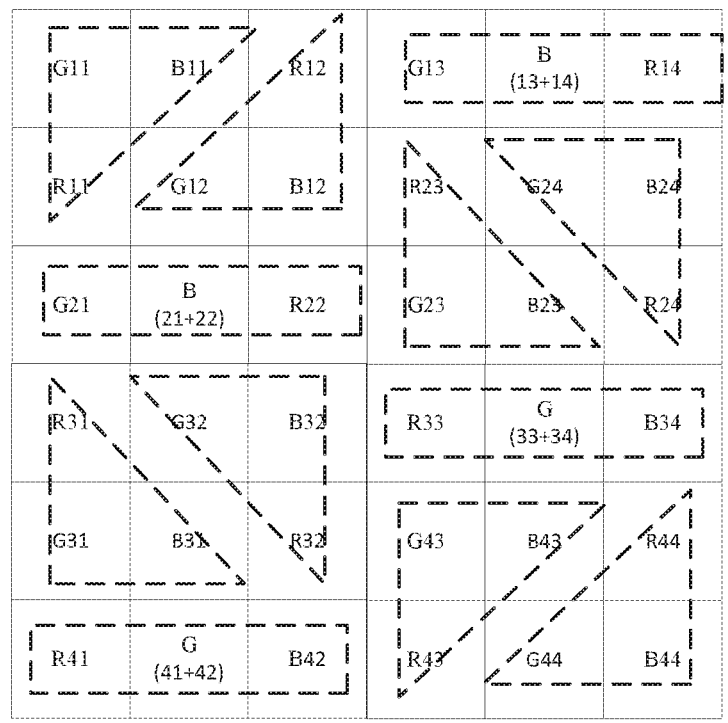
FIG. 15 is a schematic equivalent diagram of the pixel structure in FIG. 14.

In FIGS. 14 and 15, in each target pixel unit group, one sub-pixel only in a rectangular pixel unit needs to bear color components of sub-pixels with corresponding consistent colors in two basic pixel units, a color component of this sub-pixel is equal to a maximum value or an average value of the color components of the sub-pixels with corresponding consistent colors in the two basic pixel units.

Specifically, in the target pixel unit P1, a color component of the green sub-pixel is equivalent to that of the green sub-pixel G11 in the basic pixel unit P1'. A color component of the red sub-pixel is equivalent to that of the red sub-pixel R11 in the basic pixel unit P1'. A color component of the blue sub-pixel is equivalent to that of the blue sub-pixel B11 in the basic pixel unit P1'. In the target pixel unit P2, a color component of the red sub-pixel is equivalent to that of the red sub-pixel R12 in the basic pixel unit P2'. A color component of the green sub-pixel is equivalent to that of the green sub-pixel G12 in the basic pixel unit P2'. A color component of the blue sub-pixel is equivalent to that of the blue sub-pixel B12 in the basic pixel unit P2'.

In the target pixel unit P3, a color component of the red sub-pixel is equivalent to that of a red sub-pixel (for example, R22) in the basic pixel unit P4'. A color component of the green sub-pixel is equivalent to that of a green sub-pixel (for example, G21) in the basic pixel unit P3'. A color component of the blue sub-pixel is equivalent to a maximum value or an average value of color components of two blue sub-pixels B21 and B22 in the basic pixel units P3' and P4'.

Based on the pixel structure described above, the present invention provides a pixel drive method matching the pixel structure. In the method, a conventional Real RGB pixel structure is compressed to render four pixel units in a theoretical pixel unit group equivalent to three pixel units in a target pixel unit group (a compression rate reaches 75%), such that a color component of at least one sub-pixel in the target pixel unit group is equivalent to a maximum value or an average value of color components of two sub-pixels in the theoretical pixel unit group. Thus, at least one sub-pixel in the target pixel unit group performs functions of two sub-pixels in the theoretical pixel unit group. Such a pixel drive method is particularly applicable to a high-PPI (the PPI reaches 300 or above) pixel structure. Experiment results show that, higher PPI of a display screen results in a better effect of the pixel structure and its drive method.

It should be noted that, the embodiments in the specification are described progressively, each embodiment emphasizes a part different from other embodiments, and identical or similar parts of the embodiments may be obtained with reference to each other.

The above embodiments describe the present invention in detail. However, it should be understood that, the above merely describes preferred embodiments of the present invention, and is not intended to limit the present invention. Any replacements and modifications made by persons of ordinary skill in the art according to the disclosed content should all fall within the protection scope of claims of the present invention.

What is claimed is:

1. A method for driving a pixel structure, wherein the pixel structure comprises a plurality of pixel rows, each pixel row comprising a first sub-pixel, a second sub-pixel, and a third sub-pixel arranged successively, two light-emitting regions of sub-pixels of a same color in two adjacent odd-numbered pixel rows are aligned with each other; light-emitting regions of sub-pixels of a same color in two adjacent even-numbered pixel rows are aligned with each other; and light-emitting regions of sub-pixels with a same color in adjacent odd-numbered and even-numbered pixel rows are staggered from each other;

the method for driving the pixel structure comprising:
dividing an image into a plurality of theoretical pixel unit groups each comprising four basic pixel units, each basic pixel unit comprising three sub-pixels arranged side by side, and determining a color component of each sub-pixel in the theoretical pixel unit group; and dividing the pixel structure into a plurality of target pixel unit groups each equivalent to one of the theoretical pixel unit groups, each of the target pixel unit groups comprising three target pixel units with each target pixel unit comprising three sub-pixels, and determining color component of each sub-pixel in the target pixel unit group according to the color component of each sub-pixel in the corresponding theoretical pixel unit group, wherein a color component of at least one sub-pixel in the target pixel unit group is equal to a maximum value or an average value of color components of two sub-pixels of a same color in the corresponding theoretical pixel unit group, wherein each of a first target pixel unit and a second target pixel unit has two sub-pixels having color components that are equal to a maximum value or an average value of color components of two corresponding sub-pixels of the same color in the corresponding theoretical pixel unit group, and a color component of a sub-pixel in a middle position of a third target pixel unit is equal to a maximum value or an average value of color components of two sub-pixels of the same color in the corresponding theoretical pixel unit group.

2. The method of claim 1, wherein in the target pixel unit group, the first target pixel unit and the second target pixel unit are triangular shaped, and the third target pixel unit is rectangular shaped.

3. The method of claim 1, wherein a color component of each of the three sub-pixels in the third target pixel unit is equal to a maximum value or an average value of color components of two corresponding sub-pixels of the same color in the corresponding theoretical pixel unit group.

4. The method of claim 1, wherein the maximum value or the average value of color components of two sub-pixels is determined by a drive IC of an OLED display screen.

5. The method of claim 1, wherein the first sub-pixel, the second sub-pixel, and the third sub-pixel are identical in shape and dimension, and each of the first sub-pixel, the second sub-pixel, and the third sub-pixel has a shape of a rectangle with a length-width ratio smaller than 1.5:1.

6. The method of claim 1, wherein a common borderline between the first sub-pixel and the second sub-pixel adjacent to each other in a same row coincides with an extending center line of a closest third sub-pixel in an adjacent row along a column direction.

7. The method of claim 1, wherein two adjacent sides of the first sub-pixel, the second sub-pixel or the third sub-pixel are connected by one or more arcs and/or one or more straight lines.

8. The method of claim 1, wherein the pixel structure is divided into a plurality of target pixel unit groups according to a Real RGB arrangement manner, dimensions of each of the target pixel unit groups in a row direction are equivalent to dimensions of a corresponding one of the theoretical pixel unit groups in the row direction, and dimensions of each of the target pixel unit groups in a column direction are equivalent to dimensions of a corresponding one of the theoretical pixel unit groups in the column direction.

9. A pixel structure, comprising:
a plurality of pixel rows, each pixel row comprising a first sub-pixel, a second sub-pixel and a third sub-pixel arranged successively, two light-emitting regions of sub-pixels of a same color in two adjacent odd-numbered pixel rows being aligned with each other; light-emitting regions of sub-pixels of a same color in two adjacent even-numbered pixel rows being aligned with each other, and light-emitting regions of sub-pixels with a same color in adjacent odd-numbered and even-numbered pixel rows being staggered from each other;

wherein an image is divided into a plurality of theoretical pixel unit groups each comprising four basic pixel units, each basic pixel unit comprising three sub-pixels arranged side by side; and the pixel structure is divided into a plurality of target pixel unit groups each equivalent to one of the theoretical pixel unit groups, each of the target pixel unit groups comprising three target pixel units with each target pixel unit comprising three sub-pixels, a color component of at least one sub-pixel in the target pixel unit group being equal to a maximum value or an average value of color components of two sub-pixels of a same color in the corresponding theoretical pixel unit group, wherein each of a first target pixel unit and a second target pixel unit has two sub-pixels having color components equal to a maximum value or an average value of color components of two corresponding sub-pixels of the same color in the corresponding theoretical pixel unit group, and a color component of a sub-pixel in a middle position of a third target pixel unit is equal to a maximum value or an average value of color components of two sub-pixels of the same color in the corresponding theoretical pixel unit group.

10. The pixel structure of claim 9, wherein in the target pixel unit group, the first target pixel unit and the second target pixel unit are triangular shaped, and the third target pixel unit is rectangular shaped.

11. The pixel structure of claim 9, wherein a color component of each of the three sub-pixels in the third target pixel unit is equal to a maximum value or an average value of color components of two corresponding sub-pixels of the same color in the corresponding theoretical pixel unit group.

12. The pixel structure of claim 9, wherein the maximum value or the average value of color components of two sub-pixels is determined by a drive IC of an OLED display screen.

13. The pixel structure of claim 9, wherein the first sub-pixel, the second sub-pixel, and the third sub-pixel are identical in shape and dimension, and each of the first sub-pixel, the second sub-pixel, and the third sub-pixel has a shape of a rectangle with a length-width ratio smaller than 1.5:1.

14. The pixel structure of claim 9, wherein a common borderline between the first sub-pixel and the second sub-pixel adjacent to each other in a same row coincides with an extending center line of a closest third sub-pixel in an adjacent row along a column direction.

15. The pixel structure of claim 9, wherein two adjacent sides of the first sub-pixel, the second sub-pixel or the third sub-pixel are connected by one or more arcs and/or one or more straight lines.

16. The pixel structure of claim 9, wherein the pixel structure is divided into a plurality of target pixel unit groups according to a Real RGB arrangement manner, dimensions of each of the target pixel unit groups in a row direction are equivalent to dimensions of a corresponding one of the theoretical pixel unit groups in the row direction, and dimensions of each of the target pixel unit groups in a column direction are equivalent to dimensions of a corresponding one of the theoretical pixel unit groups in the column direction.

* * * * *